United States Patent
Makino

[11] Patent Number: 5,877,928
[45] Date of Patent: Mar. 2, 1999

[54] ELECTRONIC CIRCUIT DEVICE

[75] Inventor: Hiroshi Makino, Tokyo, Japan

[73] Assignee: Mitsubishi Denki Kabushiki Kaisha, Tokyo, Japan

[21] Appl. No.: 905,220

[22] Filed: Aug. 1, 1997

[30] Foreign Application Priority Data

Mar. 14, 1997 [JP] Japan ................................ 9-061524

[51] Int. Cl.⁶ .................................................... H02H 3/20
[52] U.S. Cl. .............................. 361/91; 307/31; 307/36
[58] Field of Search ................................ 361/88, 91, 56, 361/111; 307/31, 32, 36, 39; 323/229

[56] References Cited

U.S. PATENT DOCUMENTS 5,703,790   12/1997   Farwell ..................................... 307/31

FOREIGN PATENT DOCUMENTS 61-73421   4/1986   Japan .
2-100502   4/1990   Japan .

*Primary Examiner*—Sally C. Medley
*Attorney, Agent, or Firm*—Burns, Doane, Swecker & Mathis, LLP

[57] ABSTRACT

First and second terminals between which a predetermined source voltage is applied and between which are connected, a plurality of electronic circuit blocks connected in series, and a plurality of semiconductor devices which are turned on when voltages exceeding predetermined threshold voltages thereof are applied thereto. The sum of threshold voltages of the plurality of semiconductor devices is higher than the source voltage. The semiconductor devices are forward-connected in series between the first terminal and the second terminal, wherein connection points among the plurality of electronic circuit blocks connected in series are connected to selected connection points among the plurality of semiconductor devices connected in series so that at least one of the semiconductor devices is connected in parallel in respective one of the plurality of electronic circuit blocks.

6 Claims, 3 Drawing Sheets

ELECTRONIC CIRCUIT DEVICE

BACKGROUND OF THE INVENTION

1. Field of the Invention

The present invention relates to a reduction in the values of currents flowing through an electronic circuit device such as a semiconductor integrated circuit and a reduction in power consumption.

2. Description of the Related Art

With the development of portable apparatuses, it has been recently desired that semiconductor integrated circuits such as an LSI, etc. provide less power consumption for longer battery life. As effective means for realizing the less power consumption, the operating voltage may be lowered. It has been said in general that since power consumption is given by the product of the voltage and current, both the voltage and current can be reduced by lowering the operating voltage, whereby a synergistic effect results in a reduction in power consumption.

When the current value is reduced, power wiring is rendered easy and manufacturing costs are also reduced. It is however general that a source voltage used for the entire system using a semiconductor integrated circuit is constant and the source voltage used for the entire system is supplied to the semiconductor integrated circuit.

FIG. 5 is a circuit diagram showing a conventional configuration wherein two types of electronic circuit blocks are activated by a source voltage of 3.3 volts. In the drawing, reference numeral 1 indicates a power terminal, reference numeral 2 indicates a ground (GND) terminal, and reference numerals 3 and 4 indicate electronic circuit blocks such as semiconductor integrated circuits or the like electrically connected in parallel between the power terminal 1 and the ground terminal 2. Since loads on the electronic circuit blocks 3 and 4 vary in time sequence when the two electronic circuit blocks 3 and 4 are activated, the two electronic circuit blocks 3 and 4 cannot be put in use by simply series-connecting them between the source voltage and the ground. Therefore, it is known in general that the two electronic circuit blocks 3 and 4 are used by connecting them in parallel between the source voltage and the ground as shown in FIG. 5.

Assuming that the values of currents that flow through the electronic circuit blocks 3 and 4, are defined as $I_1$ and $I_2$ respectively as shown in FIG. 5, power $W_1$ to be used by the entire electronic circuit blocks 3 and 4 is expressed in the following equation:

$$W_1 = 3.3 \times (I_1 + I_2) \quad (1)$$

Thus, when the voltage applied to the system is constant, the achievement of the reduction in power consumption needs to reduce $(I_1+I_2)$.

The currents flowing through the respective electronic circuit blocks 3 and 4 can be reduced by providing voltage converters to activate the electronic circuit blocks 3 and 4 at low voltages and lowering voltages applied across the electronic circuit blocks 3 and 4. In such a case, however, power to be used by the voltage converters themselves is added together and each voltage converter needs a large area. It is therefore so difficult to incorporate them into a small chip such as a semiconductor integrated circuit.

Since the conventional electronic circuit device is constructed as described above, a problem arises in that it encounters difficulties in realizing the reduction in power consumption while holding its size and cost reductions.

SUMMARY OF THE INVENTION

With the foregoing problem in view, it is therefore an object of the present invention to provide an electronic circuit device capable of achieving a reduction in power consumption while holding its size and cost reductions when it has a plurality of electronic circuit blocks.

According to one aspect of the present invention, for achieving the above object, there is provided an electronic circuit device comprising first and second terminals between which a predetermined source voltage is applied, a plurality of electronic circuit blocks connected in series between the first terminal and the second terminal, and a plurality of semiconductor devices turned on when voltages exceeding predetermined threshold voltages thereof are applied thereto, the sum of threshold voltages being set higher than the source voltage, said semiconductor devices being forward-connected in series between said first terminal and said second terminal, wherein each of connecting points among the plurality of electronic circuit blocks connected in series is electrically connected to a selected one of connecting points among the plurality of semiconductor devices connected in series so that at least one of the semiconductor devices is connected in parallel to each one of the plurality of electronic circuit blocks. Thus, an advantageous effect can be brought about in that currents do not necessarily pass through all of the plurality of series-connected semiconductor devices, and voltages respectively applied across the electronic circuit blocks reach low voltages within a predetermined range.

In the electronic circuit device according to the present invention, the number of the semiconductor devices parallel-connected to the individual electronic circuit blocks of the plurality of electronic circuit blocks is set based on operating voltages of the respective electronic circuit blocks. Therefore, the electronic circuit device can bring about an advantageous effect in that power consumption can be reduced and the most suitable voltages can be supplied to each electronic circuit block.

Further, in the electronic circuit device according to the present invention, the plurality of semiconductor devices comprise diodes. Thus, the electronic circuit device can bring about an advantageous effect in that power consumption can be reduced at low cost.

Moreover, in the electronic circuit device according to the present invention, the plurality of semiconductor devices comprise field-effect transistors. Therefore, the electronic circuit device can bring about an advantageous effect in that a threshold voltage can be suitably set according to the design of the field-effect transistor.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The present invention will now be described with reference to the accompanying drawings wherein.

DETAILED DESCRIPTION OF THE PREFERRED EMBODIMENTS

Preferred embodiments of the present invention will hereinafter be described with reference to the accompanying drawings.

First Embodiment

Figure 1:
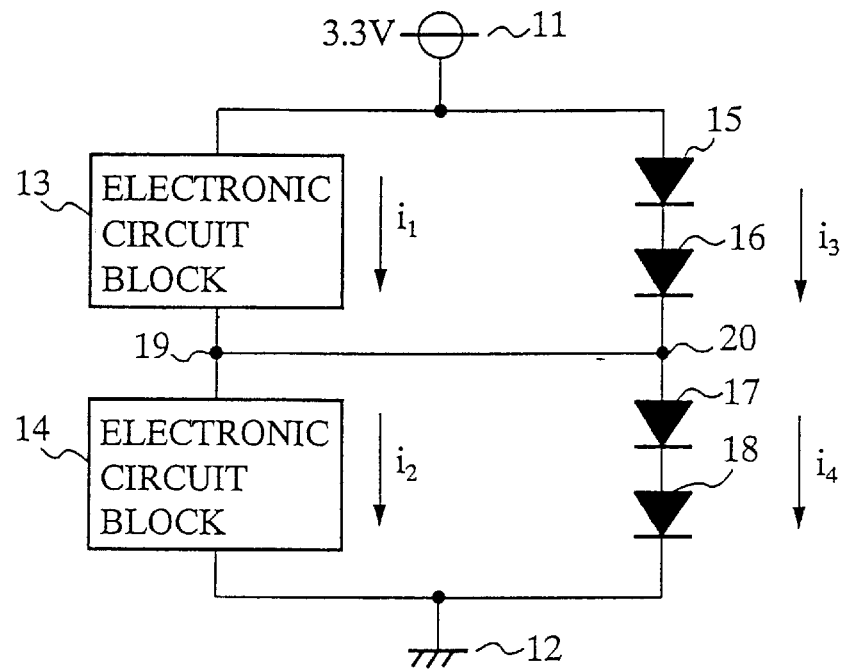
FIG. 1 is a circuit diagram showing a configuration of an electronic circuit device according to a first embodiment of the present invention.

FIG. 1 is a circuit diagram showing a configuration of an electronic circuit device according to a first embodiment of the present invention. In the drawing, reference numeral 11 indicates a 3.3-volt power terminal (first terminal), reference numeral 12 indicates a ground (GND) terminal (second terminal), reference numerals 13 and 14 indicate electronic circuit blocks respectively, and reference numerals 15 through 18 indicate pn-junction diodes (semiconductor elements or devices) respectively. The electronic circuit blocks 13 and 14 are electrically connected in series between the power terminal 11 and the ground terminal 12. Further, the diodes 15 through 18 are electrically forward-connected in series between the power terminal 11 and the ground terminal 12. A connecting point 19 between the electronic circuit block 13 and the electronic circuit block 14 and a connecting point 20 between the diode 16 and the diode 17 are electrically short-circuited. Further, the two electronic circuit blocks 13 and 14 may be those provided within one chip. Alternatively, they may be those provided within separate two chips. Also, they may be circuit blocks such as a board containing a plurality of chips, etc.

Meanwhile, when a voltage exceeding a predetermined value is applied across each of the pn-junction diodes 15 through 18 in the forward direction, the pn-junction diodes 15 through 18 are turned on so that currents flow in the forward direction. The voltage (called "on voltage") applied across each of the diodes 15 through 18 clamps between the terminals. In the first embodiment, the sum of the on voltages applied across the pn-junction diodes 15 through 18 respectively is set so as to be higher than 3.3 volts corresponding to the source voltage. Namely, the on voltage applied across each pn-junction diode is determined by a built-in potential at a pn junction and normally takes voltage values ranging from about 0.8 to 1.0 volts according to conditions at manufacture. In the first exemplary embodiment, however, 0.85 volts are used as the on voltage. In doing so, the sum of the on voltages applied across the four pn-junction diodes 15 through 18 respectively results in 3.4 volts (0.85×4). Thus, since the total on-voltage becomes higher than the source voltage 3.3 volts, the four pn-junction diodes 15 through 18 are not simultaneously turned on. Accordingly, the current available for passing through the four pn-junction diodes 15 through 18, does not flow all of these simultaneously.

As shown in FIG. 1, a current flowing through the electronic circuit block 13, a current flowing through the electronic circuit block 14, a current flowing through the diodes 15 and 16, and a current flowing through the diodes 17 and 18 are defined as $i_1$, $i_2$, $i_3$ and $i_4$ respectively. When the electronic circuit blocks 13 and 14 are both in a non-operating state and $i_1=i_2=0$ in the electronic circuit device having the configuration described above, $i_3=i_4=0$. When at least one of the electronic circuit blocks 13 and 14 is in an operating state, the potential at the connecting point 19 takes values that fall between 1.6 volts and 1.7 volts. The reason for this is as follows: When the potential at the connecting point 19 is higher than 1.7 volts, the pn-junction diodes 17 and 18 are turned on so that the potential at the connecting point 19 is brought back to 1.7 volts. Further, when the potential at the connecting point 19 is lower than 1.6 volts, the pn-junction diodes 15 and 16 are turned on so that the potential at the connecting point 19 is brought back to 1.6 volts. Therefore, the potential at the connecting point 19 always falls between 1.6 volts and 1.7 volts in this exemplary embodiment.

If attention is next focused on the relationship of magnitude between the current $i_1$ flowing through the electronic circuit block 13 and the current $i_2$ flowing through the electronic circuit block 14, it is then as follows: Namely, when $i_1 \geq i_2$, the potential at the connecting point 19 reaches 1.7 volts, and the current $i_3$ flowing through the diodes 15 and 16 results in 0 and the current $i_4$ flowing through the diodes 17 and 18 reaches the difference between the current $i_1$ flowing through the electronic circuit block 13 and the current $i_2$ flowing through the electronic circuit block 14. On the other hand, when $i_2 < i_1$, the potential at the connecting point 19 becomes 1.6 volts, and the current $i_4$ flowing through the diodes 17 and 18 results in 0 and the current $i_3$ flowing through the diodes 15 and 16 results in the difference between the current $i_2$ flowing through the electronic circuit block 14 and the current $i_1$ flowing through the electronic circuit block 13. The above description is summarized as follows:

$$\text{when } i_1 \geq i_2, \, i_3=0, \, i_4=i_1-i_2$$
$$\text{when } i_1 < i_2, \, i_3=i_2-i_1, \, i_4=0 \tag{2}$$

Thus, the current flowing from the power terminal 11 to the ground terminal 12 in the electronic circuit device according to the first embodiment takes the value of the largest one of $i_1$ and $i_2$ regardless of the relationship of magnitude between $i_1$ and $i_2$. If the large one of $i_1$ and $i_2$ is expressed as max ($i_1$, $i_2$), then power consumption $W_2$ is given by the following equation:

$$W_2 = 3.3 \times \max(i_1, i_2) \tag{3}$$

Figure 5:
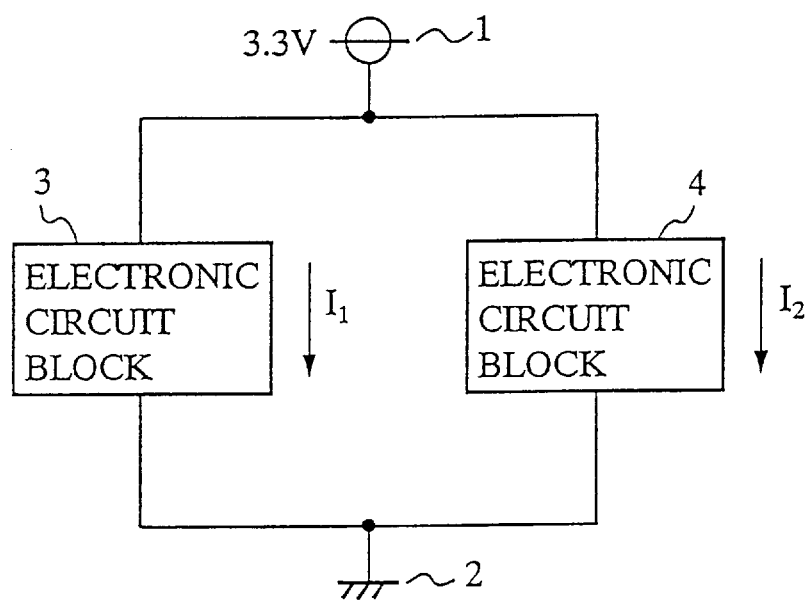
FIG. 5 is a circuit diagram illustrating a configuration of a conventional electronic circuit device.

Further, the following relationship is generally established assuming that the electronic circuit blocks 13 and 14 are equivalent to electronic circuit blocks 3 and 4 shown in FIG. 5.

$$I_1 > i_1, \, I_2 > i_2 \tag{4}$$

It is thus understood that $W_2 < W_1$ is derived and the electronic circuit device according to the present embodiment provides less power consumption.

In the first embodiment, the electronic circuit blocks 13 and 14 needs to operate at voltages ranging from 1.6 volts to 1.7 volts. However, the operating voltage of the semiconductor integrated circuit is reduced with advances in its miniaturization. A miniaturization level of 0.5 μm or less permits easy implementation of the operation at 1.6 volts to 1.7 volts.

Since the currents themselves flowing through the respective electronic circuit blocks 13 and 14 can be reduced as expressed in the equation (4), power wiring becomes easy as well as the pronounced effect of low power consumption. It is also possible to reduce the manufacturing cost.

Further, the first embodiment has described the case in which the pn-junction diodes are used. However, other diodes such as Schottky diodes or the like having electrical characteristics similar to the pn-junction diodes may be used in place of the pn-junction diodes. The same effects as described above can be obtained.

Moreover, the first embodiment has described the case in which the two circuits are activated. Even if three or more circuits are used, the same configuration as described above can be implemented by suitably defining voltage conditions. Thus, the same effects as described above can be obtained.

In the configuration shown in FIG. 1, the two diodes are electrically connected in parallel to each of the electronic circuit blocks 13 and 14. However, the number of diodes is determined according to the source voltage and the operating voltage of each circuit. If diodes (semiconductor devices) 21 and 22 whose on voltages are respectively 0.95 volts, are configured so as to be respectively electrically connected in parallel one by one to electronic circuit blocks 13a and 14a activated at low voltages under a source voltage of 1.8 volts, then the potential at a connecting point 19a ranges from 0.85 volts to 0.95 volts. Therefore, a prescribed range of voltages from 0.85 volts to 0.95 volts are applied across each of the electronic circuit blocks 13a and 14a.

Second Embodiment

Figure 3:
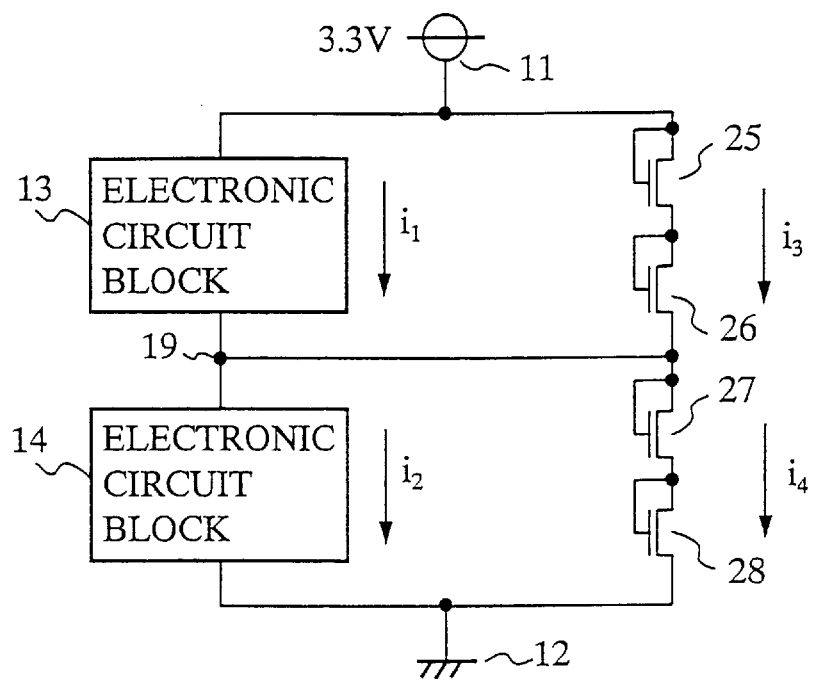
FIG. 3 is a circuit diagram depicting a configuration of an electronic circuit device according to a second embodiment of the present invention.

FIG. 3 is a block diagram showing a configuration of an electronic circuit device according to a second embodiment of the present invention. In the drawing, reference numerals 25, 26, 27 and 28 indicate MOSFETs (semiconductor devices or field-effect transistors) respectively. Namely, n-channel MOSFETs 25 through 28 are used in place of the pn-junction diodes 15 through 18 shown in FIG. 1. Incidentally, the same elements of structure as those shown in FIG. 1 are identified by like reference numerals and the description of certain common elements will therefore be omitted.

The drain and gates of the n-channel MOSFETs 25 through 28 are placed in common use and electrically connected to the high-potential side, whereas the sources thereof are electrically connected to the low-potential side. When the drain and gates of the n-channel MOSFETs are commonly used, they can be regarded as elements having two terminals. When the voltage between the gate and source of each MOSFET exceeds a predetermined voltage called a threshold voltage, they are generally turned on, whereas when the voltage is below the threshold voltage, they are generally turned off. Therefore, when the voltage between the two terminals of any of the n-channel MOSFETs 25 through 28 exceeds the threshold voltage, any of them performs the same operation as each diode referred to above. It is therefore possible to realize the same operation as in the first embodiment and obtain the same effects as those obtained by the first embodiment. Further, since the threshold voltage of each MOSFET is different from the on voltage applied across each diode and can be freely set as needed, the values of currents can be reduced more effectively by more efficiently setting the operating voltage of the circuit shown in FIG. 3.

The second embodiment has shown the case in which the n-channel MOSFETs 25 through 28 have been used. However, even if the gates and drains of p-channel MOSFETs are placed in common use and electrically connected to the low-voltage side and the sources thereof are electrically connected to the high-voltage side, effects precisely similar to those described above can be obtained.

Figure 2:
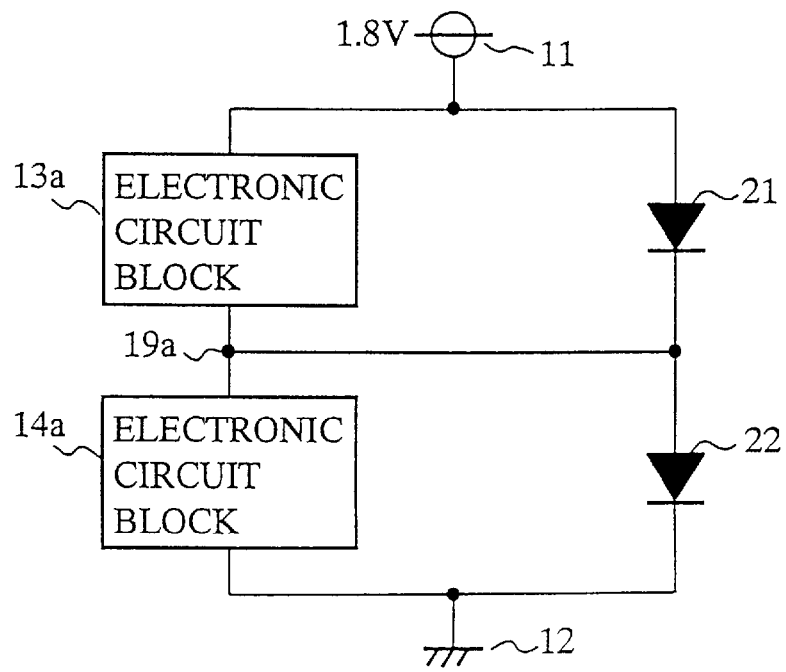
FIG. 2 is a circuit diagram illustrating a configuration of the electronic circuit device according to the first embodiment of the present invention, in which the number of diodes employed therein is set as one for each electronic circuit block.

Further, MOSFETs can be also used in place of the diodes 21 and 22 in the circuit shown in FIG. 2.

Third Embodiment

Figure 4:
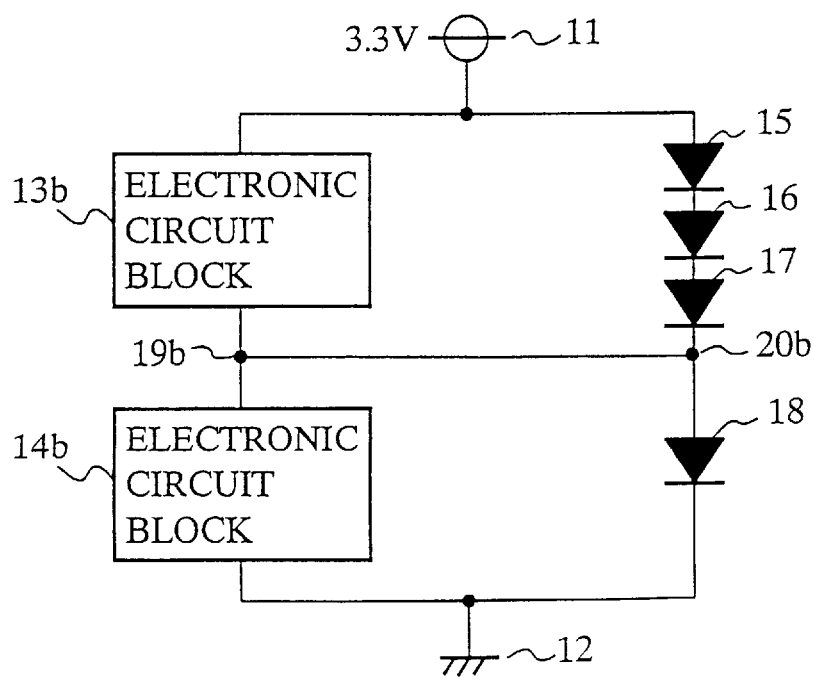
FIG. 4 is a circuit diagram showing a configuration of an electronic circuit device according to a third embodiment of the present invention.

FIG. 4 is a circuit diagram showing a configuration of an electronic circuit device according to a third embodiment of the present invention. In the drawing, the same elements of structure as those shown in FIG. 1 are identified by the same reference numerals and the description of certain common elements will therefore be omitted.

Reference numerals 13b and 14b indicate electronic circuit blocks respectively. Reference numeral 19b indicates a connecting point between the electronic circuit block 13b and the electronic circuit block 14b. Reference numeral 20b indicates a connecting point between a diode 17 and a diode 18. Incidentally, the electronic circuit block 13b needs a voltage higher than that necessary for the electronic circuit block 14b.

Since a source voltage of 3.3 volts does not reach a voltage of 3.4 volts capable of turning on the entire diodes 15 through 18 because the on voltage applied across each of the diodes 15 through 18 is 0.85 volts as has been described in the first embodiment, all the diodes are not turned on. When the potential at the connecting point 19b becomes higher than 0.85 volts, the diode 18 is turned on so that the on voltage is brought back to 0.85 volts. On the other hand, when the potential at the connecting point 19b becomes lower than 0.75 volts, the diodes 15 through 17 are turned on so that the on voltage is brought back to 0.75 volts corresponding to a voltage obtained by subtracting 2.55 (=0.85× 3) volts corresponding to the sum of the on voltages for the diodes 15 through 17 from the source voltage 3.3 volts. Therefore, the potential at the connection point 19b is maintained at voltages ranging from 0.75 to 0.85 volts. Thus, the voltages ranging from 2.45 volts to 2.55 volts are applied across the electronic circuit block 13b and the voltages ranging from 0.75 volts to 0.85 volts are applied across the electronic circuit block 14b.

Therefore, power consumption can be reduced as a whole and the voltages required to optimally activate the electronic circuit blocks 13b and 14b can be supplied.

In the third embodiment, the numbers of the diodes connected in parallel to the electronic circuit blocks 13b and 14b are set as three and one respectively. However, the number of the diodes can be selected and configured in various forms according to the operating voltage of each electronic circuit block or the source voltage.

Even in the case of the third embodiment, p- or n-channel MOSFETs can be used in place of the diodes.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An electronic circuit device comprising:

first and second terminals between which a predetermined source voltage is applied;

a plurality of electronic circuit blocks connected in series between said first terminal and said second terminal; and a plurality of semiconductor devices which are turned on when voltages exceeding predetermined threshold voltages thereof are applied thereto, the sum of threshold voltages of said plurality of semiconductor devices being set higher than the source voltage, said semiconductor devices being forward-connected in series between said first terminal and said second terminal;

wherein each of connecting points among said plurality of electronic circuit blocks connected in series is respectively electrically connected to a selected point among said plurality of series connected semiconductor devices so that at least one of said plurality of semiconductor devices is connected in parallel to a respective one of said plurality of electronic circuit blocks.

2. An electronic circuit device as claimed in claim 1, wherein the number of said semiconductor devices connected in parallel to respective ones of said plurality of electronic circuit blocks is based on an operating voltage of said each electronic circuit block.

3. An electronic circuit device as claimed in claim 2, wherein said plurality of semiconductor devices are diodes.

4. An electronic circuit device as claimed in claim 2, wherein said plurality of semiconductor devices are field-effect transistors whose gates and drains are connected in common with each other.

5. An electronic circuit device as claimed in claim 1, wherein said plurality of semiconductor devices are diodes.

6. An electronic circuit device as claimed in claim 1, wherein said plurality of semiconductor devices are field-effect transistors whose gates and drains are connected in common with each other.

* * * * *